United States Patent [19]
Chen

[11] Patent Number: 5,966,312
[45] Date of Patent: Oct. 12, 1999

[54] METHOD FOR MONITORING AND ANALYZING MANUFACTURING PROCESSES USING STATISTICAL SIMULATION WITH SINGLE STEP FEEDBACK

[75] Inventor: Vincent Ming Chun Chen, Milipitas, Calif.

[73] Assignee: Advanced Micro Devices, Inc., Sunnyvale, Calif.

[21] Appl. No.: 08/966,138

[22] Filed: Nov. 7, 1997

Related U.S. Application Data

[62] Division of application No. 08/566,529, Dec. 4, 1995, Pat. No. 5,719,796.

[51] Int. Cl.[6] ............................................. G06G 7/48
[52] U.S. Cl. .................. 364/578; 364/468.15; 364/488
[58] Field of Search .............................. 364/578, 468.15, 364/474.16, 478.1, 488, 484

[56] References Cited

U.S. PATENT DOCUMENTS

| | | |
|---|---|---|
| 4,827,395 | 5/1989 | Anders et al. . |
| 4,901,242 | 2/1990 | Kotan . |
| 5,105,362 | 4/1992 | Kotani . |
| 5,111,404 | 5/1992 | Kotani . |
| 5,495,417 | 2/1996 | Fuduka et al. . |
| 5,539,652 | 7/1996 | Tegethoff . |
| 5,621,652 | 4/1997 | Eakin ....................................... 364/490 |
| 5,646,870 | 7/1997 | Krivokapic et al. .................... 364/578 |

FOREIGN PATENT DOCUMENTS

| | | |
|---|---|---|
| 63-174331 | 7/1988 | Japan . |
| 1131470 | 5/1989 | Japan . |
| 5267421 | 10/1993 | Japan . |
| 6338552 | 6/1994 | Japan . |
| 2 126 374 | 3/1984 | United Kingdom . |
| WO95/31003 | 11/1995 | WIPO . |

OTHER PUBLICATIONS

Chee K. Chow, Projection of Circuit Performance Distribution by Multivariate Statistics, May 1989, pp. 60–65, IEEE Transactions on Semiconductor Manuafacturing vol. 2 No. 2.

Schneider et al.: ControlShell—A real–time software framework, IEEE.

Root et al.: Statistical Circuit Simulation With Measurement–Based Active Device Models—Implications For Process Control and IC Manufacturability, IEEE.

Austin: Creating A Mixed–Signal Simulation Capability For Concurrent IC Design and Test Program Development, IEEE.

*Primary Examiner*—Kevin J. Teska
*Assistant Examiner*—Hugh Jones
*Attorney, Agent, or Firm*—Skjerven, Morrill, MacPherson, Franklin & Friel LLP; Ken J. Koestner

[57] ABSTRACT

A statistical simulation of a semiconductor fabrication process is performed in parallel with the actual process. Input parameters derived from a probability density function are applied to the simulator which, in turn, simulates an actual fabrication process which is modeled as a probability density function. Each simulation step is repeated with a random seed value using a Monte Carlo technique, a trial-and-error method using repeated calculations to determine a best solution to a problem. The simulator generates an output in the form of a probability distribution. The statistical simulation uses single-step feedback in which a simulation run uses input parameters that are supplied or derived from actual in-line measured data. Output data generated by the simulator, both intermediate output structure data and WET data, are matched to actual in-line measured data in circumstances for which measured data is available. The probability density structure of the simulator is adjusted after each simulation step so that simulated data more closely matches in-line measured data.

21 Claims, 10 Drawing Sheets

FIG. 6A
FIG. 6B
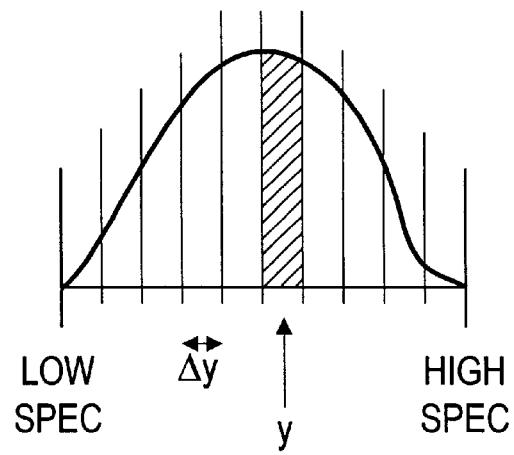
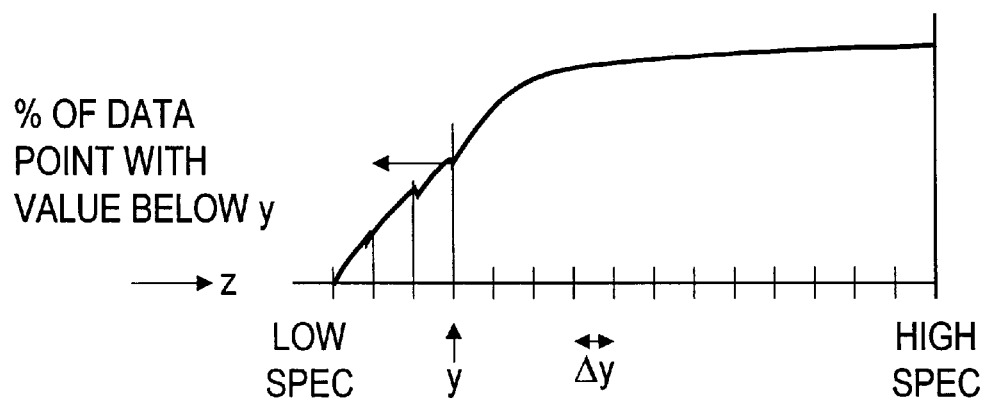
FIG. 6C

METHOD FOR MONITORING AND ANALYZING MANUFACTURING PROCESSES USING STATISTICAL SIMULATION WITH SINGLE STEP FEEDBACK

This application is a division of application Ser. No. 08/566,529, filed Dec. 4, 1995, now U.S. Pat. No. 5,719,796.

FIELD OF THE INVENTION

The present invention relates to manufacturing processes such as integrated circuit fabrication processes. More specifically, the present invention relates to a feedback system for analyzing and monitoring a manufacturing process.

BACKGROUND OF THE INVENTION

Process simulation is the usage of processing experiments, typically using a computer, as directed by mathematical models created to describe a process phenomena. Many simulation and analysis tools (for example, Pisces, Medici, Suprem3, Suprem4 and PdFab) have been developed to assist process integration and device development. These tools have not been as widely employed for integrated circuit manufacturing. Generally, these tools are developed primarily for research and development purposes and do not adequately address various difficulties that arise in the manufacturing environment.

Several characteristics are generally applicable to the manufacturing environment and distinguish the manufacturing environment from a process integration and device development environment. One characteristic of the manufacturing environment is that measurable aspects of processes are have a fundamentally statistical nature, rather than a deterministic nature. Process variations and measurement errors are inherent to manufacturing processes so that substantially all data measured in a manufacturing environment is statistical. Exact measurement values are generally not available for each device at each stage of a manufacturing process so that a single data point is insufficient to justify a decision relating to the process. For example, if it is known that application of input parameters A and B to a fabrication process to yield an output variable C, what is truly known is that input parameters A and B each have a statistical profile that, when combined in the fabrication process, yield a statistical profile C shown in FIG. 1. The most useful information available in a manufacturing environment is the form of the statistical profile which results from the process. Unfortunately, nearly all information that is utilized in the manufacturing environment and all input parameters to a fabrication tool are expressed in the form of single-valued parameters, rather than in statistical profiles.

While conventional simulation and analysis tools do not suitably address the statistical nature of manufacturing processes, these tools are also deficient in failing to take advantage of the extensive process variables, in-line measurements and Wafer Electrical Testing (WET) data measurements that are available. WET testing includes testing for various device electrical parameters including threshold voltage and drive current that are measured at a wafer level, before bonding. Conventional simulation and analysis tools designed for research and development generally presume that a fabrication process is not yet operational for actual manufacturing. Therefore, these conventional simulation and analysis tools are not sufficiently flexible for a manufacturing engineer to make optimizations of the process. Specifically, these conventional tools do not allow the manufacturing engineer to utilize the extensive statistical data that is available in a manufacturing process to optimize the simulation model. Furthermore, for simulation tools that use either an empirical approach or an analytical approach, the model fitting parameters do not have sufficient degrees of freedom to match the extensive data that are available from an actual manufacturing process.

Another characteristic of the manufacturing environment is that monitoring of manufacturing processes and improvement of these processes is a fine-tuning process. Each tuning step includes a measurement of small differences in process variables with these differences being attributable at least in part to statistical fluctuations and also to complicated interactions between multiple reactions of the process as various process parameters are modified. Process results are typically difficult to measure with accuracy. A large number of highly variable factors influence process results. Modification of a single factor in isolation from other factors is difficult. This difficulty arises not only from a limited understanding of a factor's influence on the process but also because the various factors cause complex inter-related cross effects and interactions. Thus, a simulation and analysis tool that a production engineer confidently uses needs to supply a much higher order of measured precision of the data. Mere indications of data trends are insufficient. What is sought in the development of manufacturing tools and techniques is not a drastic change in a fabricated structure, but rather a small adjustment in characteristics. For example, what typically produces an improvement in an integrated circuit structure, such as an LDD structure in a transistor, is a change in dopant dosage of about ten percent or a change in applied temperature of 100° C. The combination of the small size of the adjustments which are achieved by process modifications and the difficulty in measuring results of the modifications accurately manifest a disadvantageous characteristic of the manufacturing environment akin to a poor signal-to-noise ratio in signal processing.

Manufacturing simulation tools are calibrated prior to performing a simulation test. Calibration is typically accomplished by entering calibrated input parameters that are generated either experimentally or by previous simulation. In conventional manufacturing process calibration, a specified value of a parameter is fitted to produce a specified process output value. Realistic simulation results are rarely achieved using conventional simulation and calibration techniques since these techniques do not capture the true nature and complexity of the manufacturing process. Furthermore, conventional calibration processes require an intensive study of device engineers before a simulation tool becomes useful. Thus, the calibration processes cause significant delay in process qualification and improvement. This problem is worsened by the fact that calibration procedures are repeated continuously as the environment in the manufacturing area changes over time.

These characteristics of the manufacturing environment are applicable to an analysis of manufacturing monitoring as well as process improvements. For example, it is often desirable to know how processes change over time to track changes in fabrication results of a small amount, such as 3 percent, over time, for example 3 weeks to yield an ultimate result. Furthermore, these small differences are typically measured in an environment of statistical fluctuation and measurement error.

Although many characteristics of the manufacturing environment are disadvantageous, several are advantageous. One advantage is that specification of the structure resulting from the manufacturing process is well defined. Another advantage is that actual in-line measurement data acquired at various stages of the manufacturing process and actual WET data are plentiful and easily available. These data include statistical profile data that are highly informative regarding the manufacturing process.

What is sought is a technique for tracking and analyzing manufacturing processes such that inaccuracies arising from statistical fluctuations, complicated interactions, and measurement errors are avoided or compensated so that process modifications that produce even small differences can be measured, monitored and analyzed.

SUMMARY OF THE INVENTION

In accordance with the present invention, a statistical simulation of a semiconductor fabrication process is performed in parallel with the actual process. Input parameters extracted from actual fabrication data and expressed in the form of a probability density function are applied to the simulator which, in turn, simulates an actual fabrication process which is modeled as a probability density function. Each simulation step is repeated with a random seed value using a Monte Carlo technique, a trial-and-error method using repeated calculations to determine a best solution to a problem. The simulator generates an output in the form of a probability distribution.

The statistical simulation uses single-step feedback in which a simulation run uses input parameters that are supplied or derived from actual in-line measured data. Output data generated by the simulator, both intermediate output structure data and WET data, are matched to actual in-line measured data in circumstances for which measured data is available. The probability density structure of the simulator is adjusted after each simulation step so that simulated data more closely match in-line measured data. The essence of the single-step feedback is that one dedicated series of Monte Carlo simulations exists for the calibration of each individual process step, using calibration results from all of the previous steps. For example, if a process includes fifty process steps and one hundred Monte Carlo simulation steps are needed to build the calibration model, then the simulation process will include 5000 simulation steps in the calibration process, each starting from the first step to the calibrating step.

The statistical simulation includes two types of simulation runs including calibration runs and prediction runs. Both types of simulation runs are statistical simulations which employ a probability density function as a basic elementary unit.

The calibration run calibrates simulated output data to match actual in-line measured data. A simulation operator specifies the actual in-line measured data to be employed for the calibration run. For example, in a typical fabrication process, particular process parameters including fabrication tool-specific parameters, temperatures, pressures, deposition material concentrations, and the like, are specified independently. Results of calibration runs are compared and parameters are updated as a result of these comparisons so that the process is specialized for selected fabrication characteristics.

The described process has many advantages. One advantage is that the described apparatus and method combine statistical analysis of extensive available measurements with feedback to an in-line manufacturing process line. In addition, the automatic calibration feature of the statistical simulation method advantageously complements manual calibration of a fabrication process. A simulation operator maintains the capability to manually calibrate fabrication parameters by simply changing parameter values in the simulator. The automatic calibration feature facilitates manual calibration by furnishing a calibration framework in which specific parameters are modified independently and the results of these modifications are easily tracked. Thus, a whole range of calibration information is acquired that independently tracks modifications in specified parameters using single-step feedback.

Another advantage of the disclosed method is that the defect rate of fabricated devices is very low due to the reduction in handling. A further advantage of the method that results from the reduced handling is a substantially reduced manufacturing cost.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIGS. 6(A), 6(B) and 6(C) are a sequence of graphs which illustrate intermediate results of a measured data highpass filtering operation depicted in FIG. 5.

DETAILED DESCRIPTION

Figure 1:
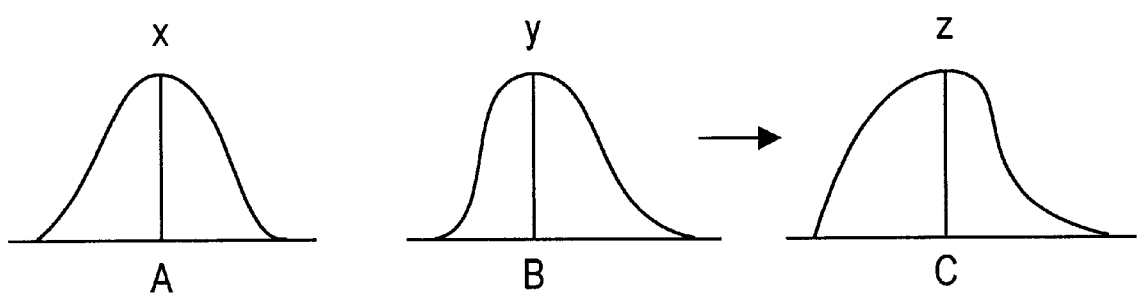
FIG. 1, labeled Prior Art, is a sequence of graphs which illustrate a black-box analysis of a manufacturing process, showing statistical profiles of two process input parameters which, in combination, yield a statistical profile of an output variable.
Figure 2:
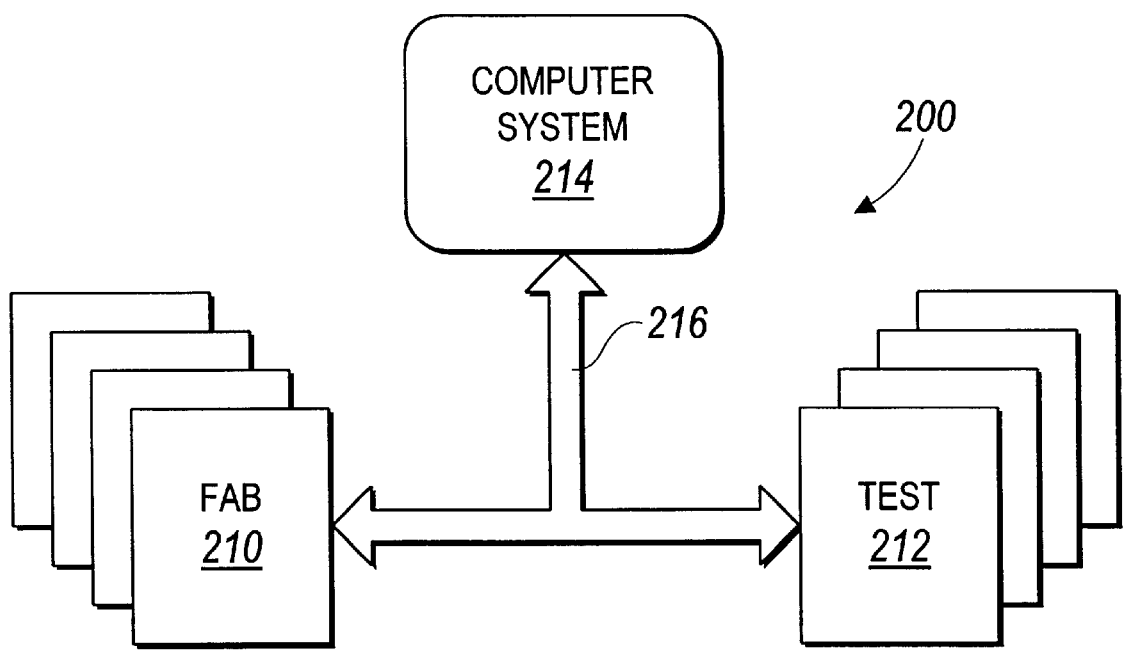
FIG. 2 is a block diagram showing components of a simulation system in accordance with an embodiment of the present invention.

FIG. 2 is a block diagram showing components of a simulation system 200, including various fabrication equipment 210, various test equipment 212 for measuring process parameters and a simulation computer system 214. In an actual fabrication process, typically a plurality of fabrication equipment 210 is employed to carry out different steps of the fabrication process. At several stages of the fabrication process, process parameters are acquired using the test equipment 212. Acquired process parameter data are conveyed to the simulation computer system over a transmission path 216. The transmission path 216 is any suitable communication system such as transmission wires or network lines. Other data transmission methods may include manual techniques such as conveyance by magnetic disk. Examples of fabrication equipment 210 include CVD reactors, vacuum pumps, ion implantation equipment, deposition equipment, photolithography equipment, optical aligners, photomasks, wafer cleaning equipment, wet etching equipment and the like. Examples of test equipment 212 include residual gas analyzers, spectral analyzers, electrical probes, optical dosimetry measurement equipment, optical microscopes, laser reflectometry equipment, spectroscopes and similar data acquisition tools that are known in the art of manufacturing. The simulation computer system 214 is any suitable computer system which includes common computational functionality and common communication operations for receiving process data. In one exemplary embodiment, a SUN SPARC 20™ application server with a network of x86 PC interface clients are employed as the computer system 214. A customized PdFab™ simulation tool and conventional software, including Microsoft Excel™ and Microsoft Access™ are used to process data.

The simulation system 200 is a simulation and analysis tool for a manufacturing environment that incorporates several objective properties. First, the simulation system 200 provides for simulation and analysis in which data is input, processed and output with an arbitrary statistical distribution profile since actual fabrication data statistics may not be distributed in a Gaussian profile. Second, the simulation system 200 furnishes a capability to utilize any measured data, if available, to improve the accuracy of simulation results. The simulation system 200 also allows data supplementation to achieve a best possible simulation even if some statistical data is not measurable or is otherwise unavailable. Third, the simulation system 200 is flexible and allows models underlying the simulation to be upgraded and improved. Fourth, the simulation system 200 performs substantially all operations promptly and automatically without conflicts with existing data collection and analyzing systems in the fabrication.

Figure 3:
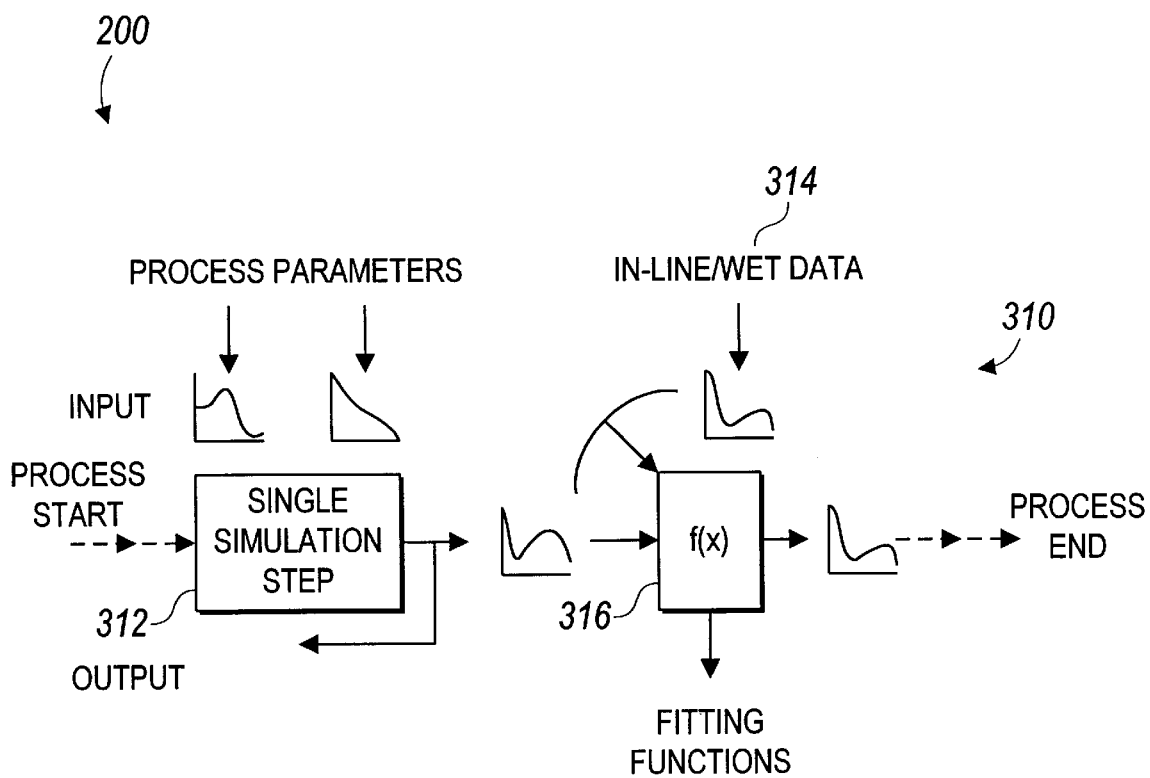
FIGS. 3A and 3B are block diagrams illustrating a two-run process of the simulation system shown in FIG. 2.
Figure 3:
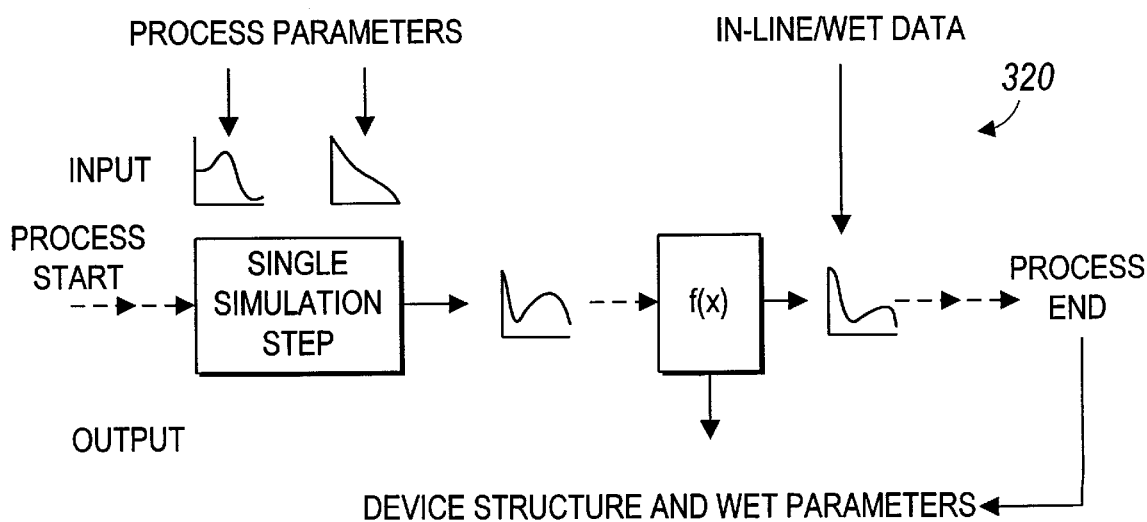

Referring to FIGS. 3A and 3B, a two-run process of the simulation system 200 includes two different run modes of operation, specifically a calibration run 310 and a prediction run 320. In the calibration run 310 depicted in FIG. 3A, available data are processed to generate fitting functions for matching simulated and measured data. The calibration run 310 includes a single simulation step 312 and actual measurements 314. Results of the simulation step 312 and the actual measurements 314 are processed according to a fitting function 316. The calibration run 310 includes a series of single simulation steps 312, each with corresponding actual measurements (both process parameters and in-line/WET data) 314. Results of a plurality of the simulation steps 312 and the actual measurements 314 are processed to produce a fitting function 316. Each simulation step 312 processes data accumulated using all fitting functions previously calculated during the calibration run 310.

In the prediction run 320 depicted in FIG. 3B, measured data and the fitting functions calculated in the calibration run 310 are used to predict unknown data. During the prediction run 320, if any process parameter is missing from the existing database, the statistical distribution function used in the corresponding calibration run 310 replaces the missing parameter. If any WET data or in-line parameter is contained in the existing dataset, these WET data or in-line parameters replace computed values without changing fitting functions.

Figure 4:
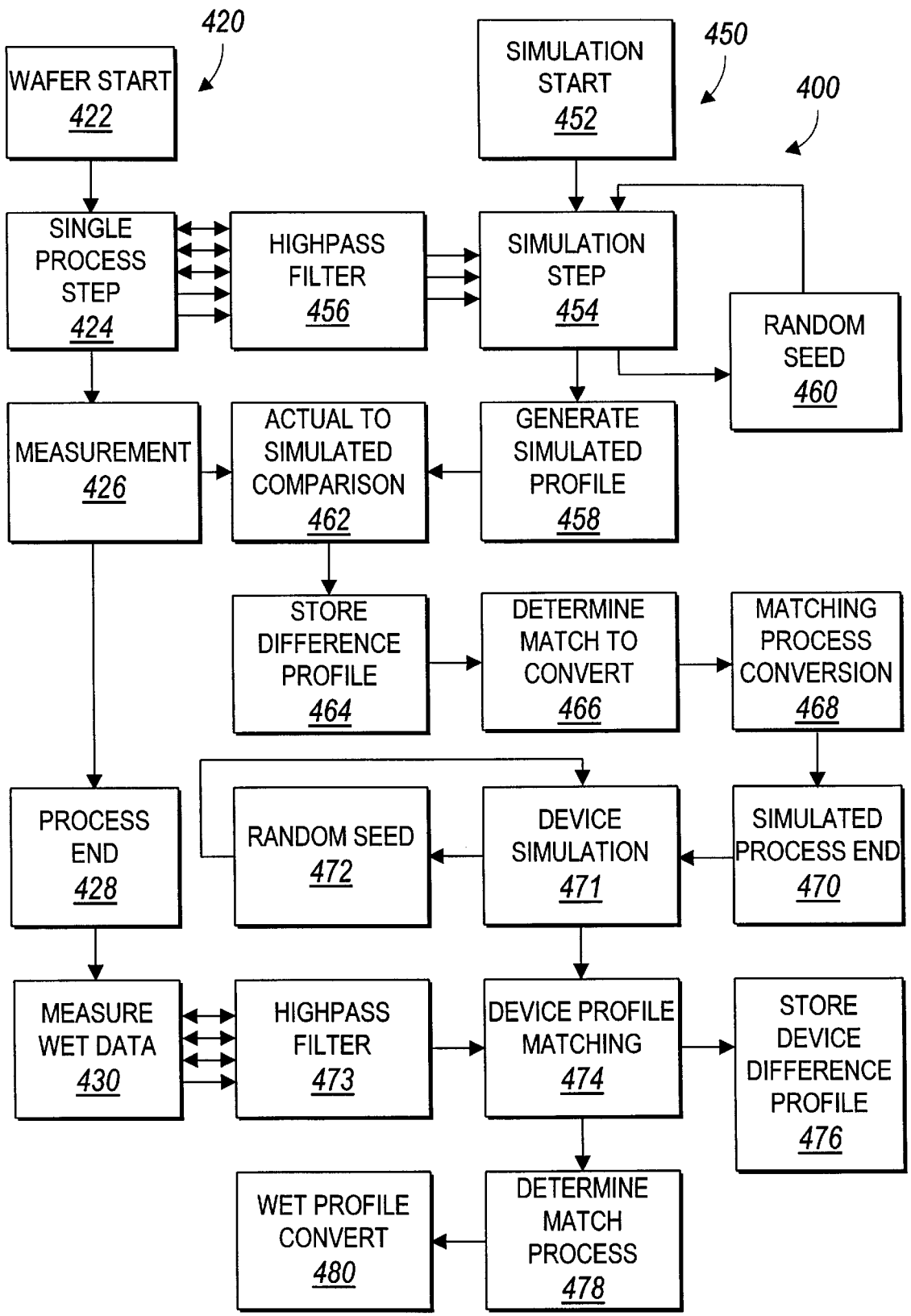
FIG. 4 is a flow chart of a calibration process of a statistical simulation method in accordance with an embodiment of the present invention.

Referring to FIG. 4, a flow chart of a calibration process 400 of the statistical simulation method is shown. The calibration process 400 includes two parallel processes including an actual in-line process 420 and a simulation process 450. The actual in-line process 420 includes with a wafer start step 422 for initializing process parameters takes place, a single process step 424 for performing a single selected fabrication process step, a measurement step 426 for measuring a result of the selected fabrication process, a process end step 428 for terminating the selected fabrication process and the measure WET data step 430 for measuring WET data parameters. Adjustment of different process steps, which are suitable for simulation analysis, of a plurality of suitable process steps is performed independently in this manner. A process step which is suitable for simulation is a process step that: (1) produces a fabrication result that is important to the functionality or structure of an integrated circuit, (2) produces a measurable result, (3) is capable of simulation, and (4) responds to changes in simulation parameters with differences in function or structure. Examples of suitable process steps include pad oxidation before channel implant, gate oxidation, gate etch and spacer oxide steps. Typically, two types of output data are measured that result from a fabrication process step, including vertical dimension data and horizontal dimension data. Examples of vertical dimension data include oxide growth, gate oxide thickness, polysilicon thickness data and the like. Horizontal dimension data include polysilicon gate length and LDD spacer width, for example.

Doping profile data results from processes which are assumed to be stable so that a doping profile is typically known, allowing simulation on the basis of theoretical estimations of parameter values, rather than measured data. In one example of a suitable selected fabrication process, the single process step 424 performs a gate oxidation process and the in-line measurement step 426 measures a data profile of oxide thickness.

Corresponding steps of the simulation process 450 are performed in parallel with steps of the actual in-line process 420. A simulation start step 452 begins the simulation process 450 in response to initializing data from the actual in-line process 420. The wafer start step 422 generates initial data, such as orientation data, that is measured and transferred to the simulation process 450, typically through a manufacturing control system, such as Workstream™, the remote access channel of the manufacturing control system, such as Remote Workstream™, and a network connection to the application server, such as TCP/IP. A simulation start step 452 initializes parameters of the simulation process 450 to arbitrary, used-defined values. Following the simulation start step 452, a simulation step 454 simulates the actual process step performed in single process step 424, first using arbitrary, user-defined parameters and later adapting the parameter values on the basis of actual in-line measurements. Various miscellaneous input parameters such as processing time are designated by the test operator. These input parameters are applied to the single process step 424 and the simulation step 454. Input data may be applied in several formats. However, the input data is converted into a statistical distribution function before actual processing begins. For an array of input data points, data is sorted and the probability of a data value being between any two consecutive data points is assumed to be the same. For data presented in statistical form, such as data with a mean, standard deviation and range limits, the data is modeled in a statistical distribution function as a truncated Gaussian profile for usage as a statistical distribution function. For data presented in a statistical form, such as a mean and range limits, the data is modeled in a statistical distribution function as a truncated Gaussian profile with each specified limit being presumed to deviate from the mean value by three standard deviations. If the mean is not centered between the range limits, the function is modeled as an asymmetric profile and is considered the combination of two half-Gaussian profiles that have the same population and different standard deviations. For data presented in a statistical form, such as a mean and standard deviation, the data is modeled in a statistical distribution function as a Gaussian profile. Data presented as a single data point is used only for parameters that are insignificant when no additional information is unavailable. Each actual or simulation result, including intermediate results, is applied to the simulation and process as a statistical distribution function, rather than a single data point. Thus, a statistical distribution function is the elementary data type in the simulation system 200.

Simulation step 454 operates on the basis of statistical simulation in which a simulation step is repeated many times. Each single simulation run computes one value from each input statistical distribution function, processes the input values in accordance with a corresponding physical or device model, and obtains a value for each output statistical distribution function. A higher number of simulation repetitions results in improved accuracy in the output distribution.

One example of an input processing parameter is a processing time parameter. In addition, various actual in-line measurements are acquired during the single process step. Results of these in-line measurements are communicated to the simulation step 454 by a highpass filter step 456. The highpass filter step 456 filters input parameters and in-line measured data from the single process step 424 and performs digitized processing to generate an output of a discrete probability density function. Simulation results from the simulation step 454 are applied to a generate simulated profile step 458 and to a random seed step 460. The random seed step 460 updates a seed value for Monte Carlo technique simulation and applies the updated seed value to the simulation step 454. The generate simulated profile step 458 constructs a simulated profile which is used for matching analysis of actual and simulated results. The simulation takes place in a plurality of Monte Carlo steps, each step including one pass through the simulation and random seed steps 454 and 460.

Multiple-pass feedback steps that are performed in the simulation and random seed steps 454 and 460 are illustrative of a single-step feedback concept for performing calibration of the simulation system 200. Each single simulation step is evaluated independently of other simulation steps. In one simulation step, data are measured and applied to a simulation step and results of the simulation are fed back to the process. Simulation results are used only to compute the fitting function for data measured within the simulation step. Using the single-step feedback concept, measured data is flexibly used to improve simulation accuracy while the interaction between different simulation steps and propagation error are reduced.

The single-step feedback concept is substantially different from conventional simulations in which an entire simulation is completed in each simulation run with intermediate output values of all simulation steps being assembled and the output fitting function being calculated all at one time.

Subsequent to the single process step 424, the in-line measurement step 426 measures the data profile of oxide thickness and communicates the data profile result to an actual data to simulated data comparison step 462. The actual data to simulated data comparison step 462 receives simulated data from the generate simulated profile step 458 and actual in-line data from the in-line measurement step 426, and compares these data profiles digital sample by digital sample, for example by calculating the point-by-point difference of the profiles. The difference profile is stored in store difference profile step 464. A determine matching process to convert step 466 determines whether to convert simulated profile data using previous simulated data or actual data on the basis of the difference profile determined by the data comparison step 462. A conversion operation is performed on the simulated profile in matching process conversion step 468 which iteratively converts the simulated profile received from the generate simulated profile step 458 on the basis of the difference profile received from the data comparison step 462. The matching process conversion step 468 combines the difference profile and the simulated profile and produces a conversion function. The conversion function is then used to match any arbitrary simulated point to a converted simulated point for latter simulation. One way to obtain the conversion function uses Newton's interpolation. Thus, for a data range defined by actual measured data, Newton's interpolation is used to define a continuous function based on percentile matching. For a data range not defined by actual measured data, a third order polynomial is used to define the continuous function. This matching method furnishes a suitable balance between flexibility and accuracy.

After each single process step and each simulation step is complete and the simulated profile is generated, additional process steps may be performed and additional simulation process steps including various simulation, highpass filter, generate simulated profile, random seed, actual data to simulated data comparison, store difference profile and determine matching process to convert and matching process conversion steps may be performed for the application of additional fabrication processes. For each single process step of actual in-line fabrication and each corresponding simulation, a full actual in-line process and a full simulation are performed, using random input parameter data, so that independent processing stages are performed with actual fabrication steps proceeding in parallel with simulated steps.

Following all actual process steps, actual processing terminates with an actual process end step 428 and the measure WET data step 430 measures the final output data of the fabrication process and generates a WET data profile. The WET data is processed in a highpass filter step 473 to generate filtered WET data.

Following all simulated process steps, simulation terminates with a simulated process end step 470 and a full device simulation is performed by device simulation step 471. The device simulation step 471 incorporates profile information derived in previous simulation steps and utilizes Monte Carlo analysis using random seed simulations. A generate device simulation profile step 471 generates a device profile that corresponds to the actual calculated WET data. A device profile matching step 474 compares the WET data to the device data generated by the device simulation step 471 digital sample by digital sample, for example by calculating the point-by-point difference of the profiles. This device difference profile is stored in store device difference profile step 476. A determine matching process to convert WET data step 478 determines whether to convert simulated profile data using previous simulated WET data or actual WET data on the basis of the difference profile determined by the device profile matching step 474. A conversion operation is performed on the simulated WET data in WET statistical profile conversion step 480 to generate the final output profile of the calibration process 400.

Output data that is generated by the calibration process 400 includes all of the matching profiles and all simulated profiles.

In some embodiments of the calibration process 400, the actual in-line process 420 and the simulation process 450 are completely automatic, being performed in parallel, simultaneously and in real time. In other embodiments, the actual in-line process 420 and the simulation process 450 are performed in parallel but not in real time so that the various actual process steps and simulation steps are performed generally independently but with data acquired from measurements on the actual in-line process 420, filtered off-line in steps such as the highpass filter step 456, and communicated to the simulation process 450, off-line.

In some embodiments of the calibration process 400, in-line data extraction from the actual in-line process 420 is automated and the highpass filtering in steps such as the highpass filter step 456 is operated for pre-selected samples of actual in-line data automatically and periodically.

Figure 5:
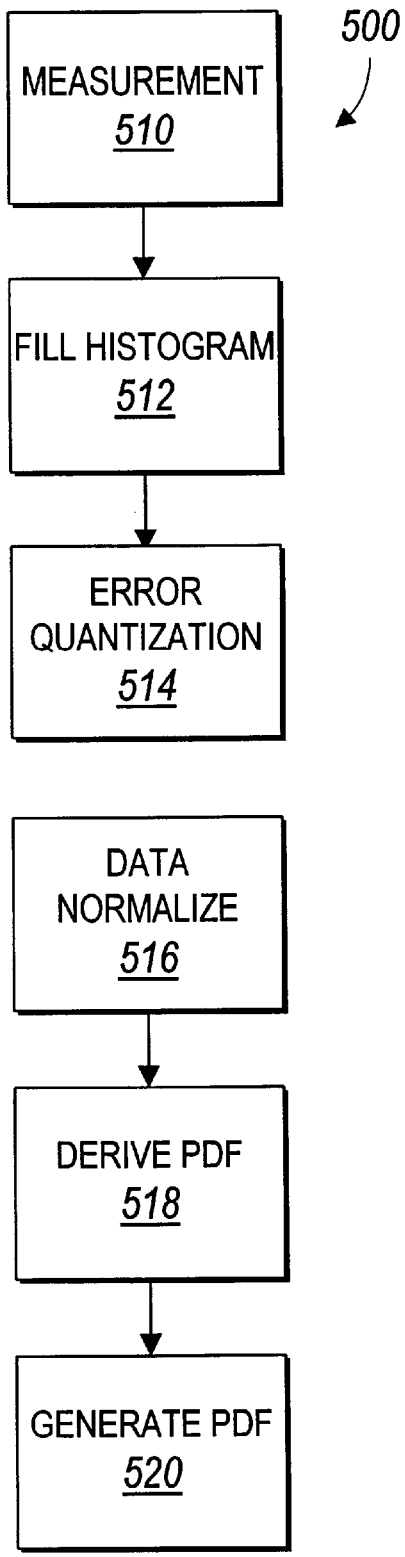
FIG. 5 is a flow chart of a measured data highpass filtering operation of the calibration process shown in FIG. 4.

Referring to FIGS. 6(A), 6(B) and 6(C) in conjunction with a flow chart shown in FIG. 5, a highpass filtering operation for highpass filtering measured data is described graphically. The highpass filtering operation is performed in the highpass filter steps 473 and 456 shown in FIG. 4, for example. FIG. 5 is a flow chart depicting steps of a highpass filter operation 500 for filtering measured data. Data is measured in measurement step 510 and measured data is counted in each of a plurality of quantized error ranges δx in fill histogram step 512. Data is in the form of process parameters, in-line measurements and WET data. Generally, process parameters include any suitable and meaningful process parameters that may be measured, observed or specified during a fabrication process. Suitable process parameters include furnace temperatures and deposition times, for example. In-line measurements include any measurements of process results such as oxide thickness for a gate oxidation process step, polysilicon thickness for deposition steps, and the like. WET data includes electrical parameter measurements such as threshold voltage (Vth), saturation threshold voltage (Vsat), maximum transconductance (Gm) and saturation current (Idsat). Process steps of pad oxidation before channel implant, gate oxidation, gate etch and spacer oxide steps are considered most influential for controlling these WET data parameters. A process parameter designates a specified parametric value which serves as an input parameter to a process. The in-line measurements and WET data are measured as results or applied as input parameters to the process.

FIG. 6(A) shows a histogram of actual in-line data measurement values shown on the horizontal axis in a quantized error range δx and the number of data points falling within each δx range of measurement values on the vertical axis. The highpass filtering operation described with respect to FIGS. 6(A), 6(B) and 6(C) operates on measured and observed data.

Referring again to FIG. 5, error quantization step 514 modifies quantization of the error term δx into a step size δy in a predetermined manner so that each δy is the largest value which is less than δx and equal to the difference between the maximum and minimum value x divided by an arbitrary integer n. FIG. 6(B) shows a histogram of actual in-line parameter values shown on the horizontal axis in terms of the n groupings of quantized step size δy. These values are normalized in data normalize step 516 so that each histogram value indicates a percentage of the total number of data points falling within each step size range.

Derive probability density function step 518 calculates a probability density function of the actual in-line parameter values. An example of the probability density function is shown in FIG. 6(C). Generate probability density table step 520 assembles a table of n probability density function values in ascending order of steps δy.

Figure 7A:
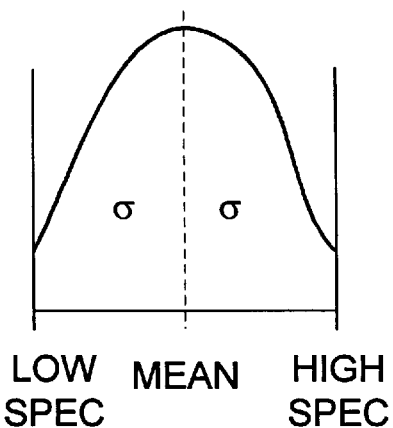
FIGS. 7(A), 7(B), 7(C), and 7(D) are a sequence of graphs which illustrate intermediate results of a specified data highpass filtering operation.
Figure 7B:
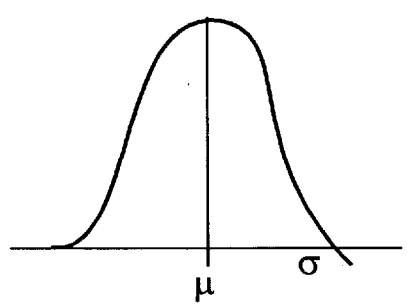
Figure 7C:
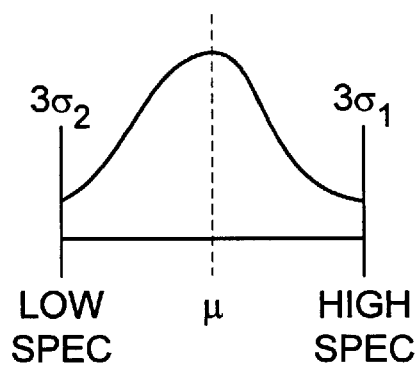
Figure 7D:
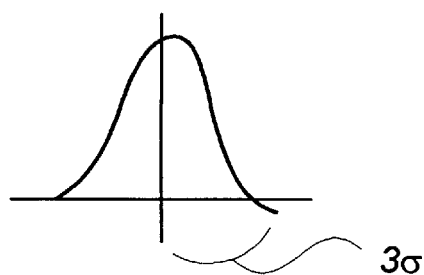

Referring to FIGS. 7(A), 7(B), 7(C) and 7(D), a highpass filtering operation for highpass filtering specified data is described graphically. For specified data, a probability density function is derived theoretically rather than experimentally so that no data is processed. Specified data is specified by various statistical parameters. In one example, specified data is specified by a mean parameter value $\mu$, a standard deviation value $\rho$, a maximum parameter value and a minimum parameter value so that a probability density function is fitted to a Gaussian distribution as is shown in FIG. 7(A). In another example, specified data is specified by a mean parameter value $\mu$ and a standard deviation value $\rho$ alone so that a probability density function is fitted to a Gaussian distribution as is shown in FIG. 7(B). In a further example, specified data is specified by a mean parameter value $\mu$, a maximum parameter value and a minimum parameter value so that a probability density function is fitted to an asymmetric Gaussian distribution as is shown in FIG. 7(C). In another example, specified data is specified by a mean parameter value $\mu$ alone so that a probability density function is estimated to a Gaussian distribution as is shown in FIG. 7(D). Generally, a more suitable probability density function is calculated when more parameters are supplied as opposed to fewer parameters.

Figure 8:
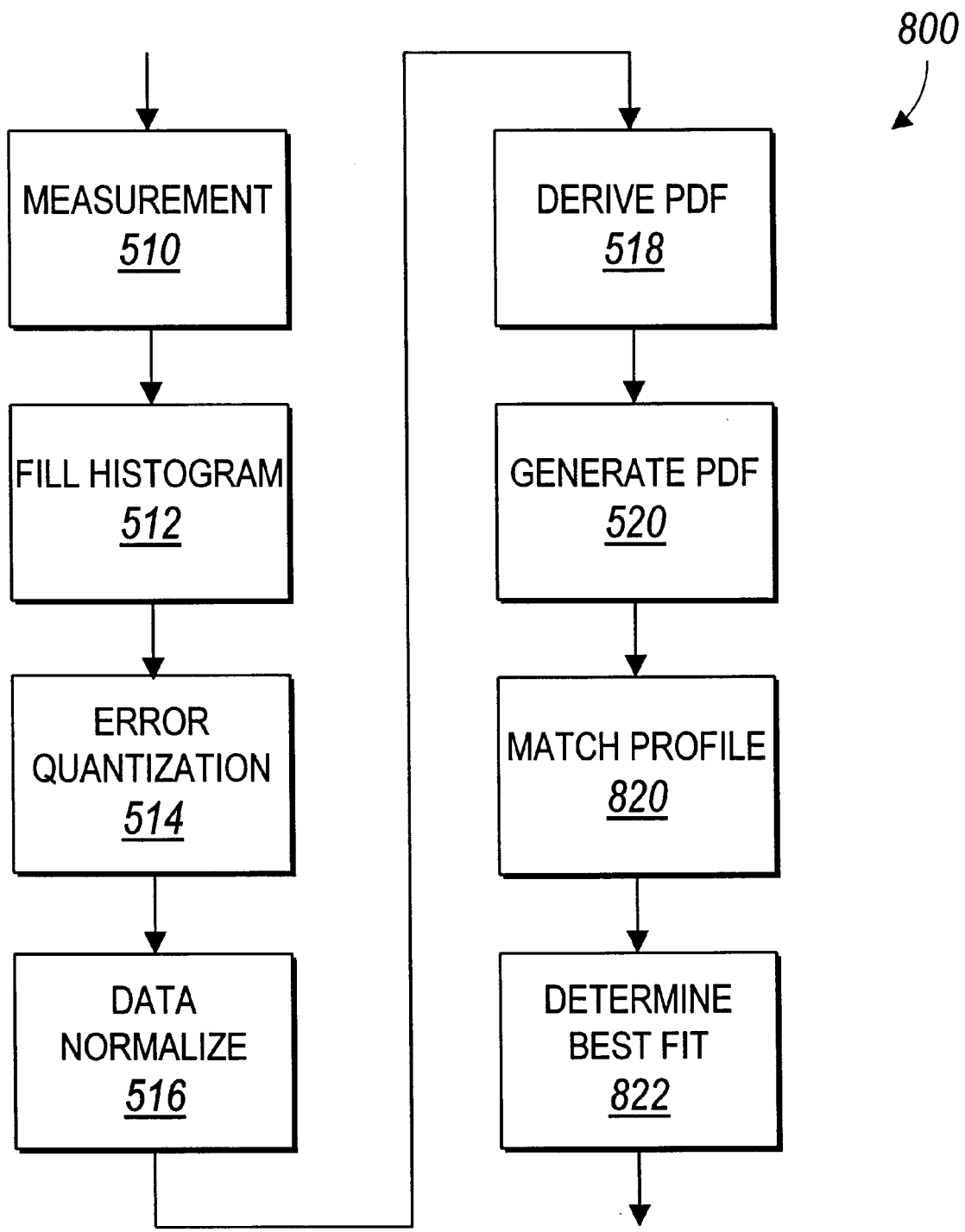
FIG. 8 is a flow chart which illustrates steps of a matching operation for matching actual data to simulated data. The matching operation is a step of the calibration process described with respect to FIG. 4.

Referring to FIG. 8, a matching operation 800 for usage in the actual data to simulated data comparison step 462 and the device profile matching step 474, both shown in FIG. 4, is illustrated by a flow chart. First, actual data is highpass filtered in the manner described with respect to FIG. 5. Specifically, the matching operation 800 includes the fill histogram step 512, the error quantization step 514, the data normalize step 516, the derive probability density function step 518 and the generate probability density table step 520. In a match profile step 820, the probability density table for simulated data generated in a step which generates simulated data such as generate simulated profile step 458 and the generate device simulation profile step 473, both shown in FIG. 4 is fitted to the probability density table for the actual data generated by the generate probability density table step 520. Profile fitting is performed by forcing the step sizes of the simulated profile δy' so that the percentage of the total number of data points falling within each variable step size range of the simulated profile matches the percentage of data points in each fixed step size range of the actual data profile. In this manner, a difference profile is generated which includes a 4 times n array of step samples. For each of the n step size samples, four elements are stored including an amplitude number indicative of the percentage of total data points for each step element, the ascending fixed-size δy steps for the actual data, the ascending variable-size δy' steps for the fitted simulated data and elements indicative of the difference step sizes δy–δy'.

In a determine best fit step 822, a best fit function for the amplitude number is derived using a selected fitting function, as is known in the art, such as a polynomial fit function, a spline function or the like. In one example of a best fit function, a constant function is applied and residue (difference) calculated, then a linear polynomial fit is applied and residue calculated. If the difference is residue is less than a designated amount, a constant function furnishes a best fit. If neither the constant nor the linear polynomial functions supply a best fit, a second order polynomial function is applied. Similarly, higher order polynomial functions are applied until a best fit is found. Generally, the best simulator is a simulator in which the best fit is a constant function or, if a constant function does not yield a best fit, a lower order polynomial function.

One advantage that is achieved by the matching operation 800 is a high simulation accuracy based on the automatically-obtained precise fitting function between a calibration output statistical distribution and actual data. This operation statistically fits two data populations for which the entire percentile distribution is known so that the fitting function for a range of parameters and data measurements is simply calculated by a direct percentile correlation. This means, for example, that 10%, 35%, and 75% of the output statistical distribution function is mapped to 10%, 35%, and 75% of the actual data. Data values between two data points is accurately measured by interpolation.

A further advantage of the matching operation 800 is that the process is flexible and applicable for substantially any profile for any number of data samples. Another advantage is that the fitting function applies to out-of-range data points. A further advantage is that low pass and high pass filters may be applied to the resulting data to compensate for measurement inaccuracy.

The matching operation 800 also handles out-of-range data and predicts possible outcomes that result from application of experimental process parameters that have values outside conventional limits. Therefore, the matching operation 800 extends beyond the region defined by calibration data. From numerical analysis theory, the higher the extrapolation function order, the larger the possible error. To compromise the accuracy and flexibility of the fitting function, a third-order polynomial is used for the fitting function in a region not defined by calibration data.

Figure 9:
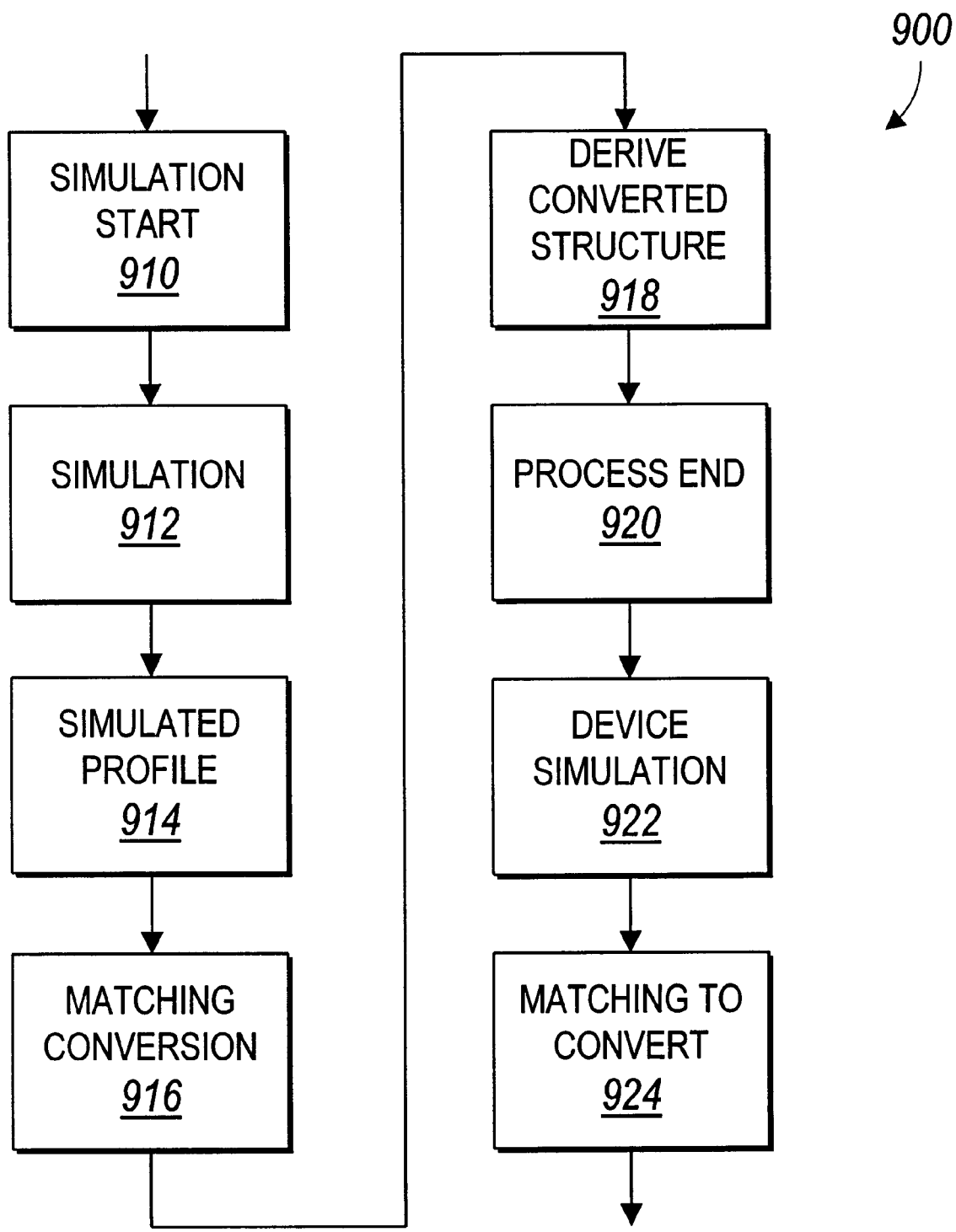
FIG. 9 is a flow chart which illustrates steps of a prediction process of a statistical simulation method in accordance with an embodiment of the present invention.

Following the calibration process, a prediction process is performed. The operator specifies input parameters for the prediction process including any operator-selected input parameters or profiles. Any input parameters that are not specified default to parameters or profiles that are derived in the calibration process. Referring to FIG. 9, a prediction process 900 begins with a simulation start step 910 in which operator-specified input parameters and profiles are entered and default input parameters and profiles are installed. In user-defined simulation step 912, a simulation is performed and profile derived using user-specified data and data from a processed table. Following the simulation step 912, a simulated profile is generated in simulated profile step 914. A matching conversion step 916 combines the difference profile and the simulated profile and produces a conversion function. A converted structure is derived in step 918. Various process parameters are simulated in this manner until a process end step 920 terminates the prediction simulation. A device simulation is then performed in device simulation step 922. A profile generated from the device simulation is then matched in matching to convert step 924, thus generating simulated WET data.

The WET data derived from device simulation is determined in precisely the same manner as the in-line data after process simulation, using the same matching and conversion techniques.

One advantage of the simulated process method is that simulated and actual data are all treated uniformly and in a statistical, rather than deterministic, manner. Another advantage is that all actual in-line data and WET data are available for usage in improving the accuracy of the simulation.

Furthermore, for an improved-stability fabrication process, data fitting is substantially automatic. In addition, physical calibration of the process is not necessary so that automatic calibration is possible by simulation is achieved before a fabrication tool is used in manufacturing. An additional advantage is that simulated data achieve improved parameter accuracy.

Figure 10:
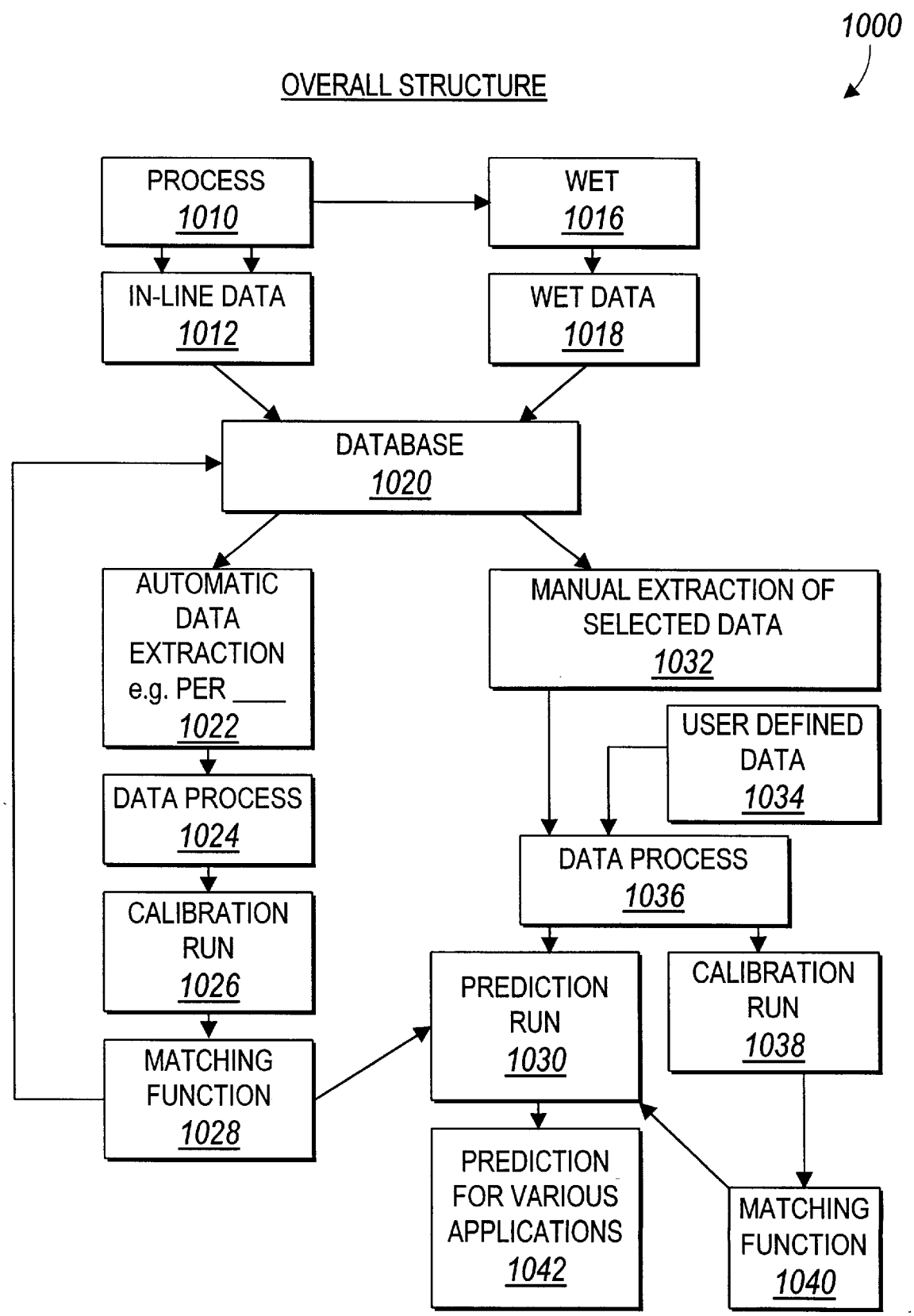
FIG. 10 is a flow chart showing elements of an overall structure of a fabrication system in accordance with an embodiment of the present invention.

Referring to FIG. 10, an overall structure of a fabrication system 1000 is shown in block diagram form. In this system 1000, a fabrication process 1010, as circuits are fabricated, generates actual in-line data that is assembled in in-line data block 1012 and information for derivation of WET data measurement step 1016. This WET data is assembled in WET data block 1018. The in-line data and WET data are entered into a database 1020. Data in the database 1020 are processed in automatic data extraction step 1022 at scheduled intervals such as weeks. These data are assembled in data process block 1024 and applied to a calibration process 1026. Matching procedures are implemented in matching function block 1028 to derive profiles and data which are entered into the database 1020. The profiles and data are applied to a prediction process 1030. Selected information in the database 1020 are also manually extracted in manual extraction block 1032 and this data along with operator-supplied data 1034 are applied to a manual data processing block 1036. Data derived in the data processing block 1036 are also applied to the prediction process 1030. A calibration process 1038 is also performed using the data from manual data processing block 1036. Information from the calibration process 1038 is used in a manual matching function block 1040 to derive profiles and data resulting from the manual extraction of selected data, which are also entered for performance of the prediction process 1030. The prediction process 1030 generates prediction information for various applications in block 1042.

One practical use of a calibration run is to simulate a fabrication process, holding all parameters constant, but taking actual in-line data measurements over time. For example, in some embodiments of the method, data may be measured weekly over multiple weeks to detect shifting in process properties over time. Other applications for statistical simulation include monitoring of manufacturing processes, process development and improvement and comparison of data for different manufacturing processes.

The description of certain embodiments of this invention is intended to be illustrative and not limiting. Numerous other embodiments will be apparent to those skilled in the art, all of which are included within the broad scope of this invention.

What is claimed is:

1. A method of monitoring a fabrication process comprising:
    performing a fabrication process step applied to a workpiece;
    acquiring a sample of a process test parameter sensed from the workpiece;
    simulating a simulated fabrication process step which corresponds to the fabrication process step to generate a plurality of simulated fabrication process results;
    looping through a simulation using single-step feedback in which a simulation step of a plurality of simulation steps uses input parameters that are supplied from actual in-line measured data and generates output data;
    matching output data generated by the simulation step against actual in-line measured data;
    adjusting a probability density structure of the simulation after each simulation step so that the simulated data more closely matches the actual in-line measured data; and generating a simulated statistical profile indicative of the simulated fabrication process results.

2. A method according to claim 1, wherein simulating further includes:

performing a Monte Carlo simulation routine for iteratively updating simulation results using a random seed value.

3. A method according to claim 1, further comprising:

formatting a plurality of process test parameter samples into a process data profile; and matching the process data profile to the simulated profile.

4. A method according to claim 1, wherein simulating is a statistical simulation of a semiconductor fabrication process, the simulation further comprising:

deriving an input parameter to the simulation from an actual fabrication process parameter, the input parameter being derived from a probability density function; and simulating an actual fabrication process, the actual fabrication process being modeled as a probability density function.

5. A method according to claim 4, wherein simulating is performed in parallel with the fabrication process.

6. A method according to claim 4, wherein simulating is a statistical simulation of a semiconductor fabrication process, simulating further comprising:

repeating a plurality of simulation steps, the repeated steps applying a varying random seed value that is varied using a Monte Carlo technique.

7. A computer program product comprising:

computer-usable medium having computable readable code embodied therein, the computable readable code implementing a method according to claim 1.

8. A method of controlling a manufacturing monitoring system, the manufacturing monitoring system including a fabrication equipment for performing a fabrication process step applied to a workpiece, a test equipment for acquiring a sample of a process test parameter sensed from the workpiece, a computer coupled to the test equipment to receive the process test parameter sample and having a memory, and a software program loadable into the memory and executable on the computer, the method comprising:

executing the software program;

receiving the process test parameter sample through operation of the software program;

simulating a simulated fabrication process operation through operation of the software program, the fabrication process operation corresponding to the fabrication process to generate a plurality of simulated fabrication process results, wherein the simulation further comprises:

looping through a simulation using single-step feedback in which a simulation step of a plurality of simulation steps uses input parameters that are supplied from actual in-line measured data and generates output data;

matching output data generated by the simulation step against actual in-line measured data; and adjusting a probability density structure of the simulation after each simulation step so that the simulated data more closely matches the actual in-line measured data;

generating a simulated statistical profile indicative of the simulated fabrication process results through operation of the software program; and controlling the manufacturing monitoring system in response to the generated simulated profile through operation of the software program.

9. A method according to claim 8 further comprising:

iteratively updating simulation results using a random seed value and a Monte Carlo simulation.

10. A method according to claim 8 further comprising:

formatting a plurality of process test parameter samples into a process data profile; and matching the process data profile to the simulated profile.

11. A method according to claim 8 further comprising:

simulating a simulated fabrication process operation in a statistical simulation further including:

deriving an input parameter to the simulation from an actual fabrication process parameter, the input parameter being derived from a probability density function;

modeling the actual fabrication process as a probability density function; and simulating an actual fabrication process.

12. A method according to claim 11 further comprising:

performing a fabrication process in parallel with the actual fabrication process simulation.

13. A method according to claim 11 further comprising:

simulating a simulated fabrication process operation in a statistical simulation further including:

repeating a plurality of simulation steps; and applying a varying random seed value that is varied according to a Monte Carlo technique.

14. A computer program product comprising:

computer-usable medium having computable readable code embodied therein, the computable readable code implementing a method according to claim 8.

15. A method of operating a manufacturing monitoring system comprising:

performing a fabrication process applied to a workpiece;

acquiring a sample of a process test parameter sensed from the workpiece;

simulating a simulated fabrication process which corresponds to the fabrication process to generate a plurality of simulated fabrication process results;

looping through a simulation using single-step feedback in which a simulation step of a plurality of simulation steps uses input parameters that are supplied from actual in-line measured data and generates output data;

matching output data generated by the simulation step against actual in-line measured data;

adjusting a probability density structure of the simulation after each simulation step so that the simulated data more closely matches the actual in-line measured data; and generating a simulated statistical profile indicative of the simulated fabrication process results.

16. A method according to claim 15 further comprising:

iteratively updating simulation results using a random seed value and a Monte Carlo simulation.

17. A method according to claim 15 further comprising:

formatting a plurality of process test parameter samples into a process data profile; and matching the process data profile to the simulated profile.

18. A method according to claim 15 further comprising:

simulating a simulated fabrication process operation in a statistical simulation further including:

deriving an input parameter to the simulation from an actual fabrication process parameter, the input parameter being derived from a probability density function; and simulating an actual fabrication process, the actual fabrication process being modeled as a probability density function.

19. A method according to claim 15 further comprising:

performing a fabrication process in parallel with the actual fabrication process simulation.

20. A method according to claim 15 further comprising:

simulating a simulated fabrication process operation in a statistical simulation further including:

repeating a plurality of simulation steps;

applying a varying random seed value that is varied using a Monte Carlo technique for the repeated steps.

21. A computer program product comprising:

computer-usable medium having computable readable code embodied therein, the computable readable code implementing a method according to claim 15.

* * * * *